United States Patent
Kozaki

(10) Patent No.: US 8,492,763 B2
(45) Date of Patent: Jul. 23, 2013

(54) SEMICONDUCTOR DEVICE INCLUDING AN EDGE SEAL AND PLURAL PAD PIECES

(75) Inventor: Shingo Kozaki, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/238,471

(22) Filed: Sep. 21, 2011

(65) Prior Publication Data

US 2012/0068176 A1    Mar. 22, 2012

(30) Foreign Application Priority Data

Sep. 22, 2010 (JP) ................. 2010-212794

(51) Int. Cl.
*H01L 23/58*    (2006.01)

(52) U.S. Cl.
USPC ........................................... 257/48

(58) Field of Classification Search
USPC ............ 257/48, 72, 773, E21.53, E21.531, 257/E21.499; 438/16, 17, 18, 460–465, 68, 438/113, 114, 11, 10, 14
IPC ............................................. H01L 21/66,21/78
See application file for complete search history.

(56) References Cited

U.S. PATENT DOCUMENTS

| | | | |
|---|---|---|---|
| 2006/0055002 A1* | 3/2006 | Yao et al. ................. | 257/620 |
| 2010/0181681 A1* | 7/2010 | Akiba et al. .............. | 257/773 |
| 2011/0049728 A1* | 3/2011 | Pagani ..................... | 257/773 |

FOREIGN PATENT DOCUMENTS

| | | |
|---|---|---|
| JP | 5-29376 | 2/1993 |
| JP | 6-204280 | 7/1994 |
| JP | 8-139189 | 5/1996 |
| JP | 2002-373869 | 12/2002 |
| JP | 2006-222147 | 8/2006 |
| JP | 2009-38137 | 2/2009 |
| JP | 2010-171156 | 8/2010 |

OTHER PUBLICATIONS

Japanese Office Action issued Jan. 29, 2013, in Japan Patent Application No. 2010-212794 (with English translation).

* cited by examiner

*Primary Examiner* — N Drew Richards
*Assistant Examiner* — Christina Sylvia
(74) *Attorney, Agent, or Firm* — Oblon, Spivak, McClelland, Maier & Neustadt, L.L.P.

(57) ABSTRACT

According to one embodiment, there is provided a semiconductor device including a semiconductor substrate, an edge seal, a plurality of pad pieces, and an insulating film pattern. The semiconductor substrate includes a chip area formed at an inward side of the semiconductor substrate when viewed in a direction perpendicular to a surface of the semiconductor substrate. The edge seal is disposed around the chip area on the surface to protect the chip area. The plurality of pad pieces are disposed on an edge region on the surface. The insulating film pattern covers edge portions of the plurality of pad pieces at a side of the edge seal, at least at one side of the chip area on the surface in a first direction and at least at one side of the chip area on the surface in a second direction.

13 Claims, 8 Drawing Sheets

US 8,492,763 B2

SEMICONDUCTOR DEVICE INCLUDING AN EDGE SEAL AND PLURAL PAD PIECES

CROSS-REFERENCE TO RELATED APPLICATIONS

This application is based upon and claims the benefit of priority from the prior Japanese Patent Application No. 2010-212794, filed on Sep. 22, 2010; the entire contents of which are incorporated herein by reference.

FIELD

Embodiments described herein relate generally to a semiconductor device and a method of manufacturing a semiconductor device.

BACKGROUND

In order to determine whether or not there is a fault in a process of manufacturing a semiconductor, a test element group (TEG) including an element such as a resistive element, a contact element, and a transistor is fabricated, and separately from a manufacturing test (Die Sort), a test for checking for the presence and absence of a fault in the manufacturing process using the TEG has been performed. In most cases, the TEG and a TEG pad serving as an electrode of the TEG are not directly necessary for the production of actual devices. For such a reason, the TEG and the TEG pad are formed on a scribe line (dicing line) to monitor and manage electrical characteristics.

In a probing method that requires a contact to the TEG pad, an inexpensive cantilever type probe pin card has been used so far. However, recently, a use of a vertical type probe card has started to be considered due to the demand for a reduction in the width of the scribe line. However, since the vertical type is expensive and is limited in its use to a pin arrangement with a pin pitch of 100 µm or more in the current situation, giving the conventional cantilever type probe a new birth of life is a best way to obtain stable contact characteristics at a low cost. However, even with the recent cantilever type probe, in the case of a pad pitch of less than 100 µm, it is difficult to manufacture the probe card with enough preciseness required for the inspection process, and so it is increasingly difficult to maintain a stable contact. Probe card manufacturers are conducting development for securing stable contact characteristics by making various efforts, such as changing a pin material to ensure a contact margin even a little bit, adjusting an angle or a size of the contact pins, and arranging neighboring pins in different patterns.

Meanwhile, in the present situation, any special countermeasures have not been taken on a pad as a contact target except for size reduction because its function as an original semiconductor is focused. In order to acquire as many chips as possible from one wafer according to a roadmap of miniaturization, the width of the scribe line needs be reduced. If the width of the scribe line is reduced, the width (area) of the TEG pad formed on the scribe line and the pad pitch of the TEG are also reduced. It is necessary for a test (inspection) of the TEG to be precisely performed that the probe pin can make a contact with the TEG pad. At this time, in order to achieve a physical contact between the probe pin and the TEG pad, the probe pin should be pressed against the TEG pad to some extent, but excessive pressing may cause the tip of the probe pin to slip out of the TEG pad, causing a short-circuit with a neighboring conductive pattern. That is, as the miniaturization progresses, the width of the scribe line is reduced, and thus making a contact to the TEG pad (an inspection pad) is increasingly difficult in the inspection process.

DETAILED DESCRIPTION

In general, according to one embodiment, there is provided a semiconductor device including a semiconductor substrate, an edge seal, a plurality of pad pieces, and an insulating film pattern. The semiconductor substrate includes a chip area formed at an inward side of the semiconductor substrate when viewed in a direction perpendicular to a surface of the semiconductor substrate. The edge seal is disposed around the chip area on the surface to protect the chip area. The plurality of pad pieces are disposed on an edge region on the surface. The insulating film pattern covers edge portions of the plurality of pad pieces at a side of the edge seal, at least at one side of the chip area on the surface in a first direction and at least at one side of the chip area on the surface in a second direction.

Exemplary embodiments of a semiconductor device and a method of manufacturing a semiconductor device will be explained below in detail with reference to the accompanying drawings. The present invention is not limited to the following embodiments.

First Embodiment

Figure 1A:
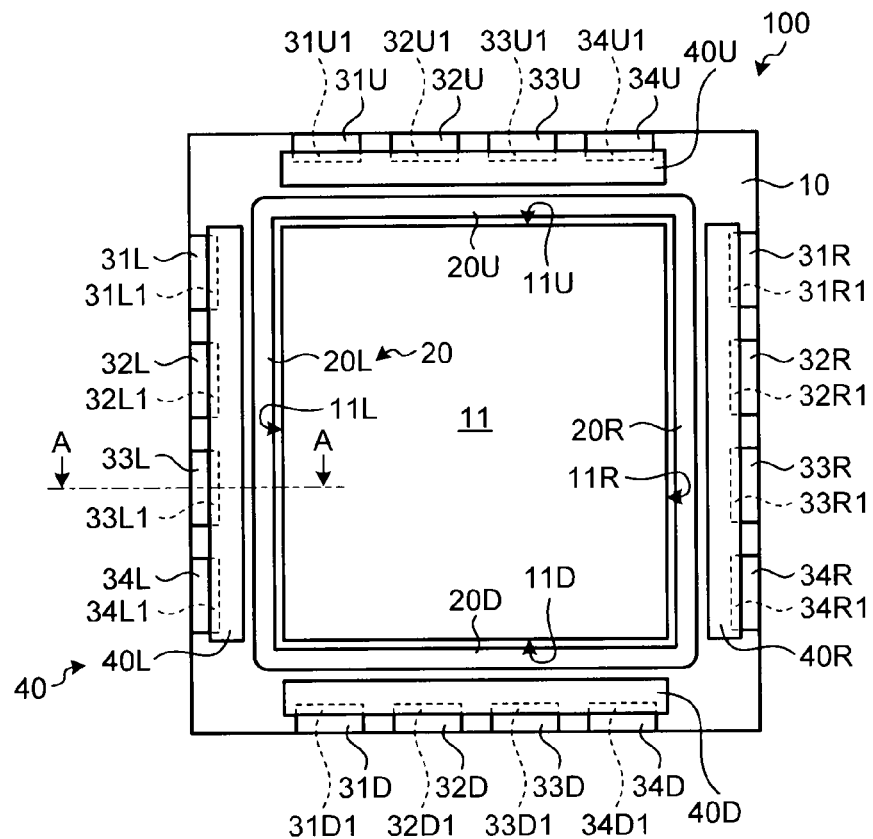
FIGS. 1A and 1B are views illustrating a configuration of a semiconductor device according to a first embodiment.
Figure 1B:
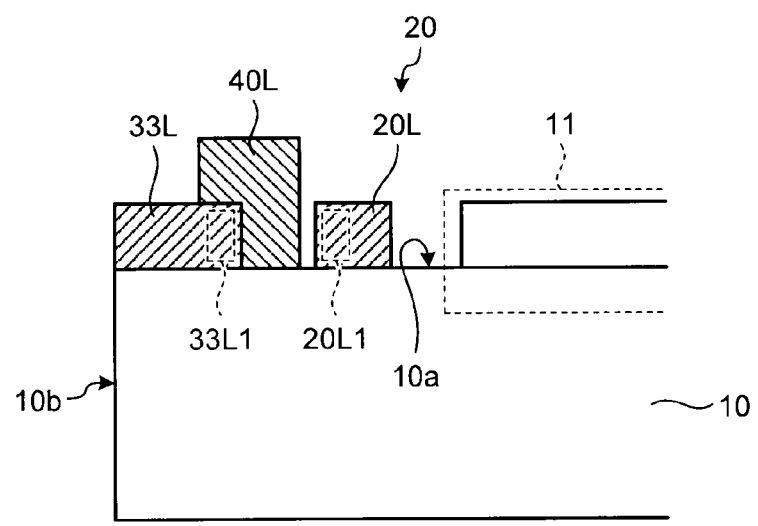

A semiconductor device 100 according to a first embodiment will be described with reference to FIGS. 1A and 1B. FIG. 1A is a plane view illustrating a layout configuration of the semiconductor device 100. FIG. 1B is an enlarged cross sectional view taken along the line A-A of FIG. 1A.

The semiconductor device 100 includes a semiconductor substrate 10, an edge seal 20, a plurality of inspection pad pieces 31L to 34D, and an insulating film pattern 40.

As illustrated in FIG. 1A, the semiconductor substrate 10 has a chip area 11 at an inner portion when viewed in a direction perpendicular to a surface 10a (see FIG. 1B). The chip area 11 is an area where predetermined circuit elements of the semiconductor device 100 are formed and is an area including a predetermined multi-layer interconnection structure formed on the surface 10a and a predetermined semiconductor area formed near the surface 10a within the semiconductor substrate 10. A side surface 10b of the semiconductor substrate 10 is a cutting surface formed when the semiconductor device 100 is cut apart from a semiconductor wafer by a scribing (dicing) process. For example, the semiconductor substrate 10 is made of a semiconductor such as silicon.

For example, the semiconductor substrate 10 has a rectangular shape. For example, the chip area 11 has a rectangular shape smaller than the semiconductor substrate 10. For example, the chip area 11 includes four sides 11L to 11D. The side (a first side) 11L is a left side of the chip area 11 in FIG. 1A, and the side 11R is a right side of the chip area 11 in FIG. 1A. The side 11U is an upper side of the chip area 11 in FIG. 1A, and the side (a second side) 11D is a lower side of the chip area 11 in FIG. 1A.

The edge seal 20 is arranged around the chip area 11 on the surface 10a of the semiconductor substrate 10. For example, the edge seal 20 extends in a loop form near the outer periphery of the chip area 11 to surround the chip area 11. Thus, the edge seal 20 absorbs stress transferred from the cutting surface (the side surface 10b) when the semiconductor device 100 is cut from the semiconductor substrate by the scribing process and protects the chip area 11 so that a crack does not develop up to the inside of the chip area 11. For example, the edge seal 20 is formed of metal such as aluminum.

For example, the edge seal 20 includes four portions 20L to 20D. The portion (a first portion) 20L extends along the side 11L of the chip area 11 and the portion 20R extends along the side 11R of the chip area 11. The portion 20U extends along the side 11U of the chip area 11 and the portion (a second portion) 20D extends along the side 11D of the chip area 11.

The plurality of inspection pad pieces 31L to 34D are arranged at the edge region on the surface 10a of the semiconductor substrate 10. Each of the inspection pad pieces 31L to 34D functions as an electrode electrically connected to a TEG which will be described later (see FIG. 4), and is part of an inspection pad used for testing (inspecting) the TEG in the inspection process prior to the scribing process. Of the inspection pads, each inspection pad piece is a portion that is not removed but left after the semiconductor device 100 is cut from the semiconductor substrate by the scribing process. Further, most part of the TEG is removed by the scribing process. For example, each of the inspection pad pieces 31L to 34D is formed of metal such as aluminum.

The plurality of inspection pad pieces 31L to 34D includes a plurality of inspection pad pieces (a plurality of first pad pieces) 31L to 34L, a plurality of inspection pad pieces 31R to 34R, a plurality of inspection pad pieces 31U to 34U, and a plurality of inspection pad pieces (a plurality of second pad pieces) 31D to 34D.

The plurality of inspection pad pieces 31L to 34L are arranged on the edge region, parallel to the side 11L, of the surface 10a of the semiconductor substrate 10. The plurality of inspection pad pieces 31L to 34L are arranged in a direction parallel to the side 11L.

The plurality of inspection pad pieces 31R to 34R are arranged on the edge region, parallel to the side 11R, of the surface 10a of the semiconductor substrate 10. The plurality of inspection pad pieces 31R to 34R are arranged in a direction parallel to the side 11R.

The plurality of inspection pad pieces 31U to 34U are arranged on the edge region, parallel to the side 11U, of the surface 10a of the semiconductor substrate 10. The plurality of inspection pad pieces 31U to 34U are arranged in a direction parallel to the side 11U.

The plurality of inspection pad pieces 31D to 34D are arranged on the edge region, parallel to the side 11D, of the surface 10a of the semiconductor substrate 10. The plurality of inspection pad pieces 31D to 34D are arranged in a direction parallel to the side 11D.

On the surface 10a of the semiconductor substrate 10, the insulating film patterns 40 are disposed at both sides of the chip area 11 in a direction (a first direction) parallel to the side 11D, and disposed at both sides of the chip area 11 in a direction (a second direction) parallel to the side 11L. The insulating film patterns 40 are disposed to extend along the edge portions of the edge seal 20 which are at the side near the inspection pad pieces 31L to 34D, and along the edge portions of the inspection pad pieces 31L to 34D which are at the edge seal 20 side. For example, the insulating film patterns 40 are formed of an insulating material such as polyimide.

Specifically, the insulating film patterns 40 includes patterns 40L to 40D.

In terms of the side 11L disposed at a side in the direction parallel to the side 11D, the pattern (a first pattern) 40L extends in a straight line form along the side 11L, mainly between the portion 20L of the edge seal 20 and the plurality of inspection pad pieces 31L to 34L. The pattern 40L extends in a straight line form, across the plurality of inspection pad pieces 31L to 34L. Thus, the pattern 40L is arranged along an edge portion 20L1 of the portion 20L of the edge seal 20 which is at the side near the inspection pad pieces 31L to 34L. Further, the pattern 40L covers edge portions 31L1 to 34L1 of the inspection pad pieces 31L to 34L which are at the portion 20L side (see FIG. 1B). That is, the pattern 40L does not cover the edge portion 20L1 of the portion 20L of the edge seal 20 which is at the side near the inspection pad pieces 31L to 34L, but covers the edge portions 31L1 to 34L1 of the inspection pad pieces 31L to 34L which are at the portion 20L side.

In terms of the side 11R disposed at a side in the direction parallel to the side 11D, the pattern 40R extends in a straight line form along the side 11R, mainly between the portion 20R of the edge seal 20 and the plurality of inspection pad pieces 31R to 34R. The pattern 40R extends in a straight line form, across the plurality of inspection pad pieces 31R to 34R. Thus, the pattern 40R is arranged along an edge portion 20R1 of the portion 20R of the edge seal 20 which is at the side near the inspection pad pieces 31R to 34R. Further, the pattern 40R covers edge portions 31R1 to 34R1 of the inspection pad pieces 31R to 34R which are at the portion 20R side. That is, the pattern 40R does not cover the edge portion 20R1 of the portion 20R of the edge seal 20 which is at the side near the inspection pad pieces 31R to 34R, but covers the edge portions 31R1 to 34R1 of the inspection pad pieces 31R to 34R which are at the portion 20R side.

In terms of the side 11U disposed at a side in the direction parallel to the side 11L, the pattern 40U extends in a straight line form, along the side 11U, mainly between the portion 20U of the edge seal 20 and the plurality of inspection pad pieces 31U to 34U. The pattern 40U extends in a straight line form, across the plurality of inspection pad pieces 31U to 34U. Thus, the pattern 40U is arranged along an edge portion 20U1 of the portion 20U of the edge seal 20 which is at the side near the inspection pad pieces 31U to 34U. Further, the pattern 40U covers edge portions 31U1 to 3491 of the inspection pad pieces 31U to 34U which are at the portion 20U side. That is, the pattern 40U does not cover the edge portion 20U1 of the portion 20U of the edge seal 20 which is at the side near the inspection pad pieces 31U to 34U, but covers the edge portions 31U1 to 34U1 of the inspection pad pieces 31U to 34U which are at the portion 20U side.

In terms of the side 11D disposed at a side in the direction parallel to the side 11L, the pattern (a second pattern) 40D extends in a straight line form, along the side 11D, mainly between the portion 20D of the edge seal 20 and the plurality of inspection pad pieces 31D to 34D. The pattern 40D extends in a straight line form, across the plurality of inspection pad pieces 31D to 34D. Thus, the pattern 40D is arranged along an edge portion 20D1 of the portion 20D of the edge seal 20 which is at the side near the inspection pad pieces 31D to 34D. Further, the pattern 40D covers edge portions 31D1 to 34D1 of the inspection pad pieces 31D to 34D which are at the portion 20D side. That is, the pattern 40D does not cover the edge portion 20D1 of the portion 20D of the edge seal 20 which is at the side near the inspection pad pieces 31D to 34D, but covers the edge portions 31D1 to 34D1 of the inspection pad pieces 31D to 34D which are at the portion 20D side.

Next, a method of manufacturing the semiconductor device 100 will be described with reference to FIGS. 2A to 2C and FIGS. 3A to 3C. FIGS. 2A to 2C and FIGS. 3A to 3C are cross-sectional views illustrating each process of a method of manufacturing the semiconductor device 100 and illustrate cross-sections corresponding to FIG. 1B. FIG. 4 is a plane view illustrating an inspection method in an inspection process (a process illustrated in FIG. 3B).

Figure 2A:
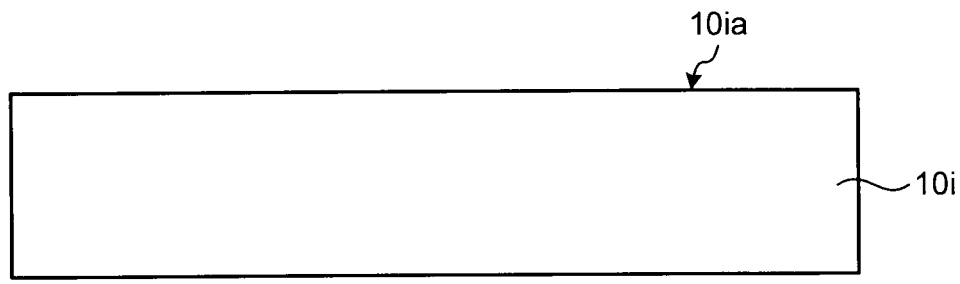
FIGS. 2A to 2C are views illustrating a method of manufacturing the semiconductor device according to the first embodiment.

In a process illustrated in FIG. 2A, a semiconductor substrate 10*i* to be used for formation of a plurality of semiconductor devices 100 and 100*a* (see FIG. 3C) is prepared. For example, the semiconductor substrate 10*i* is formed of a semiconductor such as silicon.

Figure 2B:
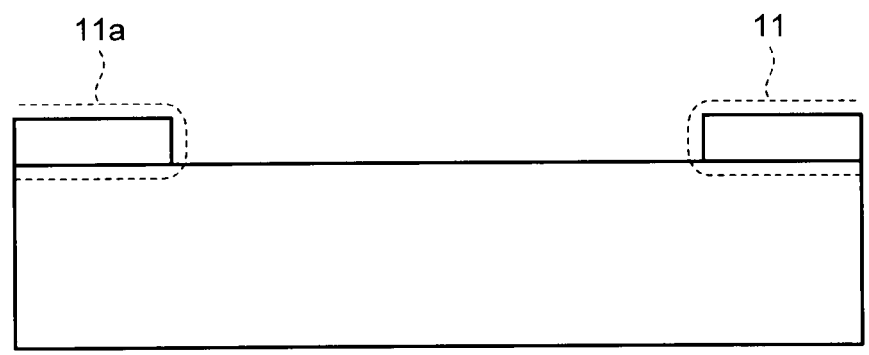

In a process illustrated in FIG. 2B, a predetermined circuitry device is formed on each of a plurality of chip areas 11 and 11*a* corresponding to the plurality of semiconductor devices 100 and 100*a*. That is, a predetermined semiconductor area is formed, inside the semiconductor substrate 10*i*, near the surface 10*ia*, and a predetermined multi-layer interconnection structure is formed on the surface 10*ia* of the semiconductor substrate 10*i*. For example, the plurality of chip areas 11 and 11*a* are two-dimensionally arranged on the semiconductor substrate 10*i* when viewed in a direction perpendicular to the surface 10*ia*. In the semiconductor substrate 10*i*, scribe lines SL extend, in a lattice form, between the plurality of chip areas 11 and 11*a* (to demarcate the plurality of chip areas 11 and 11*a*).

Figure 2C:
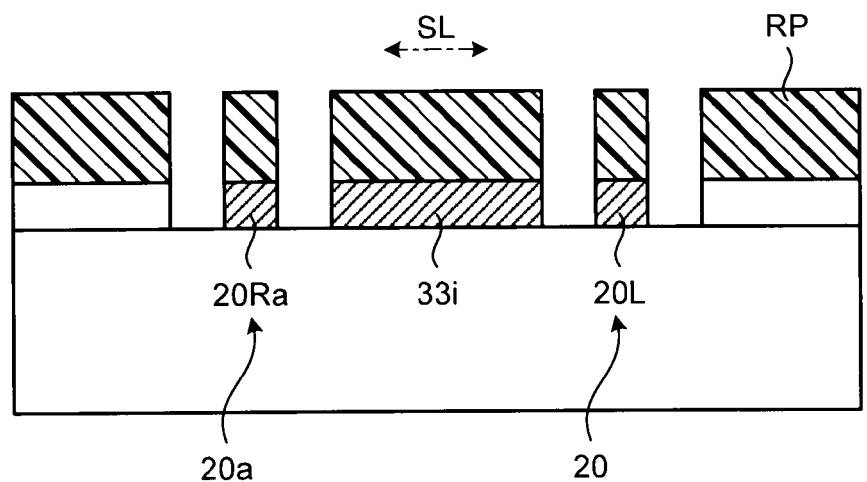

In a process illustrated in FIG. 2C, a plurality of TEGs 51 and 52 and a plurality of inspection pads 31*i* to 34*i* (see FIG. 4) are formed on the scribe line SL of the semiconductor substrate 10*i*. Further, portions 20L and 20Ra of the edge seal 20 extending along the scribe lines SL are formed at both sides of the scribe line SL. For example, the TEG 51 is connected to the inspection pads 31*i* and 32*i*. For example, the TEG 52 is connected to the inspection pads 33*i* and 34*i*.

Specifically, a resist pattern RP that covers the plurality of chip areas 11 and 11*a* and selectively covers areas that will become the inspection pads 31*i* to 34*i* and the edge seals 20 and 20*a* are formed by light exposure using lithography, and reactive ion etching (RIE) or wet etching is performed using the resist pattern RP as a mask. In this way, patterning of the inspection pads 31*i* to 34*i* and the edge seals 20 (20L) and 20*a* (20Ra) is performed. For example, the inspection pads 31*i* to 34*i* and the edge seals 20 and 20*a* are formed of metal such as aluminum, respectively.

Figure 3A:
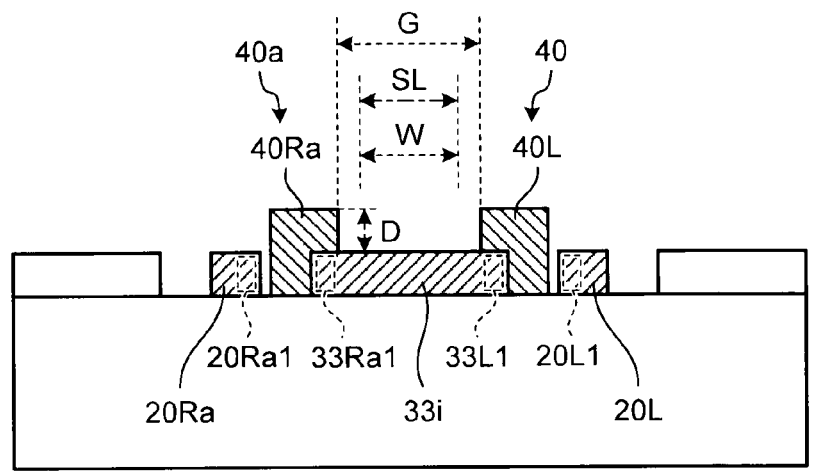
FIGS. 3A to 3C are views illustrating a method of manufacturing the semiconductor device according to the first embodiment.

In a process illustrated in FIG. 3A, insulating film patterns 40 and 40*a* covering the edge portions of the inspection pad pieces at the edge seal side are formed. For example, the pattern 40L, which covers the edge portions 31L1 to 34L1 of the inspection pads 31*i* to 34*i* at the side near the portion 20L of the edge seal 20, is formed along the edge portion 20L1 of the portion 20L of the edge seal 20 at the side near the inspection pads 31*i* to 34*i*. Further, for example, the pattern 40Ra, which covers the edge portions 31Ra1 to 34Ra1 of the inspection pads 31*i* to 34*i* at the side near the portion 20Ra of the edge seal 20*a*, is formed along the edge portion 20Ra1 of the portion 20Ra of the edge seal 20*a* at the side near the inspection pads 31*i* to 34*i*. For example, insulating film patterns 40 and 40*a* are formed of an insulating material such as polyimide. At this time, the thickness D of the insulating film patterns 40 and 40*a* is smaller than a gap G between the adjacent patterns 40L and 40Ra. That is, when the tip of the inspection probe has an angle θ (see FIG. 3B) with respect to the surface of the inspection pad, the thickness D of the insulating film patterns 40 and 40*a* has a value satisfying the following conditions:

tan θ≧D/(G/2) and D≧Dth

Dth≦D≦(G/2)tan θ

Dth represents the thickness of the insulating film pattern necessary to restrict the movement of the inspection probe not to climb up to the surface of the insulating film pattern when the tip of the inspection probe comes into contact with the side surface of the insulating film pattern. Dth is decided depending on the diameter of the tip of the inspection probe, the curvature radius of a round portion, or the like. Further, the gap G between the adjacent patterns 40L and 40Ra is larger than the width W of the scribe line SL by an expected alignment margin.

Figure 3B:
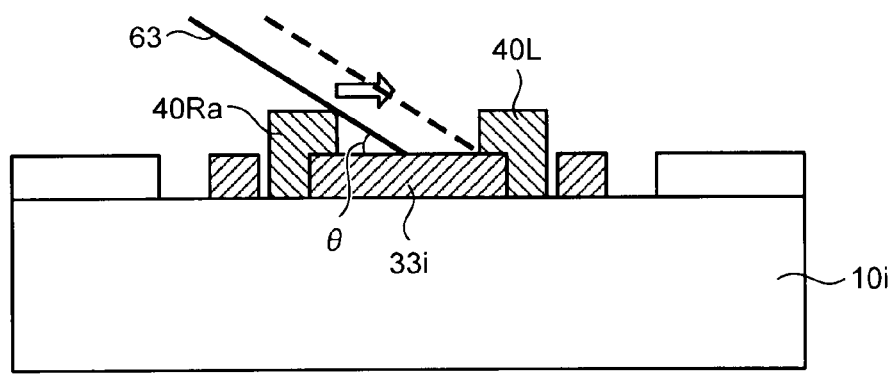
Figure 4:
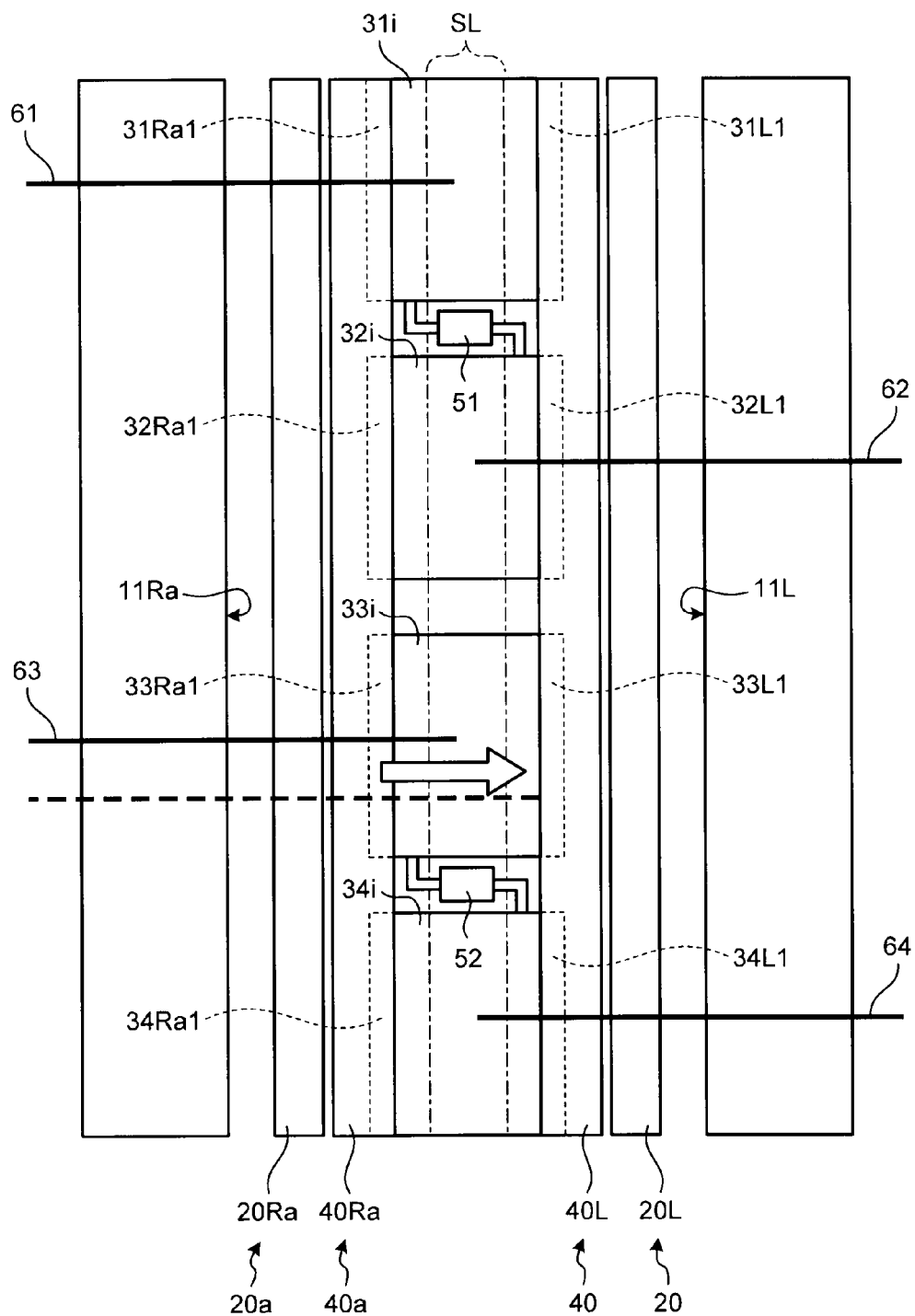
FIG. 4 is a view illustrating a method of manufacturing the semiconductor device according to the first embodiment.

In a process illustrated in FIG. 3B, the tips of inspection probes 61 to 64 are brought into contact with the inspection pads 31*i* to 34*i* in a direction intersecting the portions 20L and 20Ra of the edge seal 20 and the insulating film patterns 40 and 40*a*, and then an inspection of the TEGs 51 and 52 is performed (see FIG. 4). Predetermined signals are supplied from the inspection pads 31*i* and 32*i* to inspect the TEG 51, and predetermined signals are supplied from the inspection pads 33*i* and 34*i* to inspect the TEG 52.

Figure 3C:
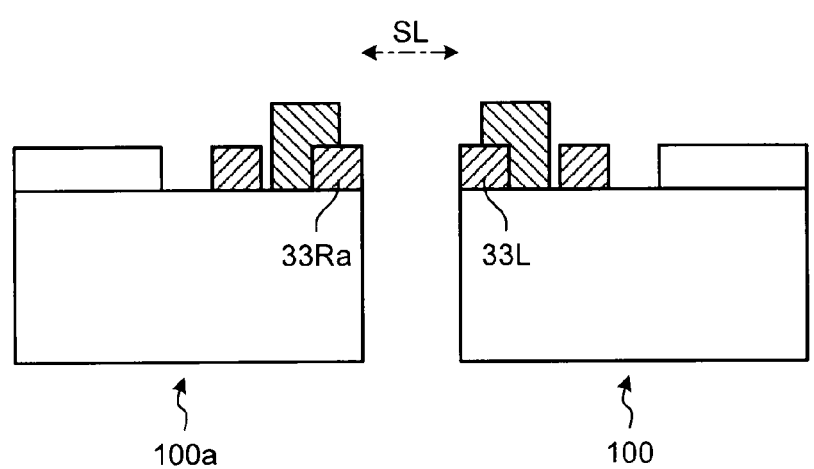

In a process illustrated in FIG. 3C, the semiconductor substrate 10*i* is cut along the scribe line SL (see FIG. 4), and the semiconductor substrate is divided into the plurality of semiconductor devices 100 and 100*a*. For this case, the inspection pad 33*i* is divided into the inspection pad piece 33L that is part of the semiconductor device 100 and the inspection pad piece 33Ra that is part of the semiconductor device 100*a*. Accordingly, the plurality of semiconductor devices 100 and 100*a* as illustrated in FIG. 1A are obtained.

Figure 8:
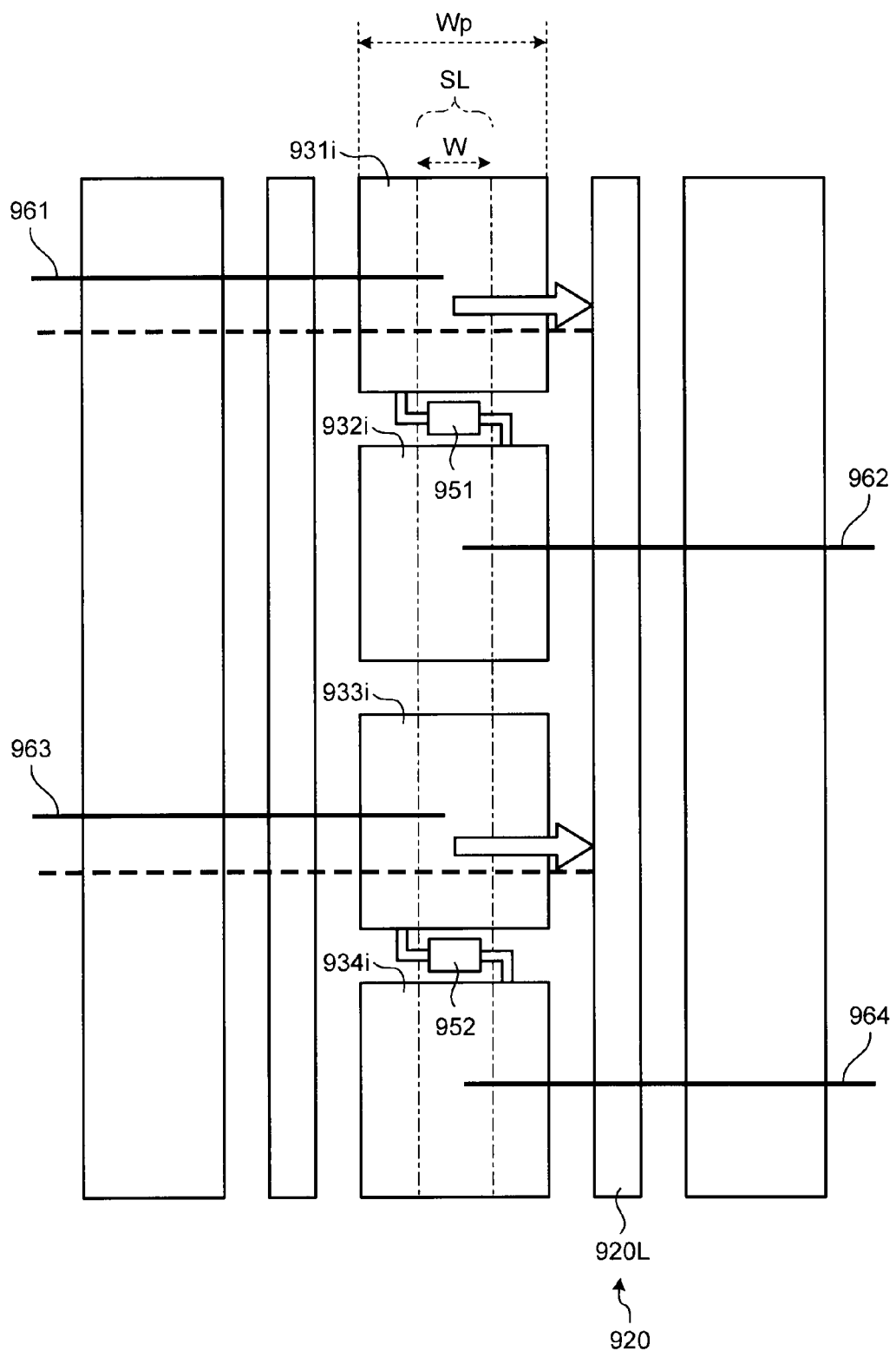
FIG. 8 is a view for explaining a semiconductor device according to a comparative example.

Here, let us assume that the insulating film patterns 40 and 40*a* are not formed in the process illustrated in FIG. 3A. In this case, for example, as illustrated in FIG. 8, when the width W of the scribe line SL is reduced, the width Wp of inspection pad 931*i* to 934*i* is reduced. In a process illustrated in FIG. 3B (the inspection process), it is necessary for a test to be precisely performed that a contact between inspection pads 931*i* to 934*i* and inspection probes 961 to 964 can be established. The inspection probes 961 to 964 need be pressed down to some extent in order to establish a physical contact. However, for example, as indicated by a void arrow in FIG. 8, when excessively pressed down, the tips of the inspection probes 961 and 963 slip out of the inspection pads 931*i* and 933*i* and then enter a state indicated by a dotted line. That is, in the process (the inspection process) illustrated in FIG. 3B, the tips of the inspection probes 961 to 964 are difficult to come into contact with the inspection pads 931*i* to 934*i*, respectively. As a result, it is difficult to test (inspect) TEG 951 and 952.

Meanwhile, in the first embodiment, in the process illustrated in FIG. 3A, the insulating film patterns 40 and 40*a*, covering the edge portions of the inspection pad pieces at the edge seal side, are formed along the edge portion of the edge seal at the side near the inspection pad pieces. Thus, in the process (inspection process) illustrated in FIG. 3B, when the inspection probes 61 to 64 are excessively pressed down so as to establish physical contacts with the inspection pads 31*i* to 34*i*, for example, as indicated by a void arrow in FIG. 4, even if the tip of the inspection probe 63 is misaligned, the tip of the inspection probe 63 is difficult to slip out of the inspection pad 33*i* and can enter a state indicated by a dotted line. That is, each of the insulating film patterns 40 and 40*a* functions as a bank for preventing the tip of the inspection probe from slipping out of the inspection pad at both sides of the scribe line SL. Thus, in the process (the inspection process) illustrated in FIG. 3B, the tips of the inspection probes 61 to 64 easily come in contact with the inspection pads 31*i* to 34*i*. As a result, the test (inspection) of the TEGs 51 and 52 can be performed.

As described above, the semiconductor device 100 manufactured through the processes illustrated in FIGS. 2A to 3C is suitable for easily establishing a contact to the inspection pad in the inspection process. That is, according to the first embodiment, the semiconductor device 100 suitable for easily establishing a contact to the inspection pad in the inspection process can be provided.

Further, when the insulating film patterns 40 and 40*a* are not formed in the process illustrated in FIG. 3A, in the process (the inspection process) illustrated in FIG. 3B, for example, as illustrated in FIG. 8, if the inspection probes 961 and 963 are excessively pressed down, each of the tips of the inspection probes 961 and 963 may come in contact with a portion 920L (an electrode pattern) of the edge seal 920. That is, a short circuit occurs between the tip of the inspection probe 961 and the tip of the inspection probe 963 via the portion 920L of the edge seal 920, and thus characteristics of the TEGs 951 and 952 are erroneously evaluated as being defective. Thus, it is difficult to perform a proper test (inspection).

On the other hand, in the first embodiment, since the insulating film patterns 40 and 40*a* are formed, even when the inspection probes 61 to 64 are excessively pressed down as described above, a state in which the tip of the inspection probe 63 comes in contact with the inspection pad 33*i* is easily maintained. Thus, since a state in which a short circuit occurs between the tip of the inspection probe and the tip of another inspection probe via the edge seal is difficult to be formed, the proper test (inspection) can be performed.

Further, let us assume that the portions 20L and 20Ra of the edge seal 20 are not formed in the process illustrated in FIG. 2C and the insulating film patterns 40 and 40*a* are not formed in the process illustrated in FIG. 3A. In this case, in the process (the inspection process) illustrated in FIG. 3B, a short circuit between the tip of the inspection probe and the tip of another inspection probe via the edge seal is prevented. However, in the process (the scribing process) illustrated in FIG. 3C, a crack is likely to develop up to the inside of the chip area 11 due to stress transferred from the cutting surface.

In contrast, in the first embodiment, since the portions 20L and 20Ra of the edge seal 20 are formed in the process illustrated in FIG. 2C, in the process (the scribing process) illustrated in FIG. 3C, the edge seal absorbs stress transferred from the cutting surface, thereby being capable of protecting the chip area 11 so that a crack does not develop up to the inside of the chip area 11 easily.

Further, in the process illustrated in FIG. 3A, the insulating film patterns 40 and 40*a* are formed along the edge portion of the edge seal at the inspection pad piece side to cover the edge portion of the inspection pad piece at the edge seal side. Thus, the insulating film patterns 40 and 40*a* have a structure that is nearly unlikely to be affected by misalignment.

Furthermore, in the process illustrated in FIG. 3A, the insulating film patterns 40 and 40*a* are formed along the scribe line SL at both sides of the scribe line SL in a straight line form. For example, the pattern 40L of the insulating film pattern 40 is formed as a pattern that extends along the side 11L of the chip area 11 in a straight line form between the portion 20L of the edge seal 20 and the plurality of inspection pads 31*i* to 34*i*. For example, the pattern 40Ra of the insulating film pattern 40*a* is formed as a pattern that extends along the side 11Ra of the chip area 11*a* in a straight line form between the portion 20Ra of the edge seal 20*a* and the plurality of inspection pads 31*i* to 34*i*. Thus, the insulating film patterns 40 and 40*a* are formed as patterns that are easily aligned between the edge seals 20 and 20*a* and the plurality of inspection pads 31*i* to 34*i*.

Further, in the process (the inspection process) illustrated in FIG. 3B, the tips of the inspection probes 61 to 64 come in contact with the inspection pads 31*i* to 34*i* in a direction intersecting the portions 20L and 20Ra of the edge seal 20 and the insulating film patterns 40 and 40*a* to perform the inspection of the TEGs 51 and 52 (see FIG. 4). Thus, for example, even if the tip of the inspection probe 63 is misaligned as indicated by a void arrow in FIG. 4, the tip of the inspection probe 63 is difficult to slip out of the inspection pad 33*i* due to the insulating film patterns 40 and 40*a* and can enter a state indicated in a dotted line. That is, each of the insulating film patterns 40 and 40*a* is formed as a pattern suitable for functioning as a bank for preventing the tip of the inspection probe 63 from slipping out of the inspection pad 33*i*.

In the cut semiconductor device 100, as illustrated in FIG. 1A, the insulating film patterns 40 and 40*a* formed in the above described manner cover the edge portions of the inspection pad pieces at the edge seal side, along the edge portion of the edge seal at the inspection pad piece side, at both sides of the chip area 11 in the direction (the first direction) parallel to the side 11D and both sides of the chip area 11 in the direction (the second direction) parallel to the side 11L. That is, according to the first embodiment, as described above, the insulating film pattern that is easily aligned (that is difficult to be affected by misalignment) and suitable for functioning as a bank for preventing the tip of the inspection probe from slipping out of the inspection pad can be implemented.

Second Embodiment

Figure 5A:
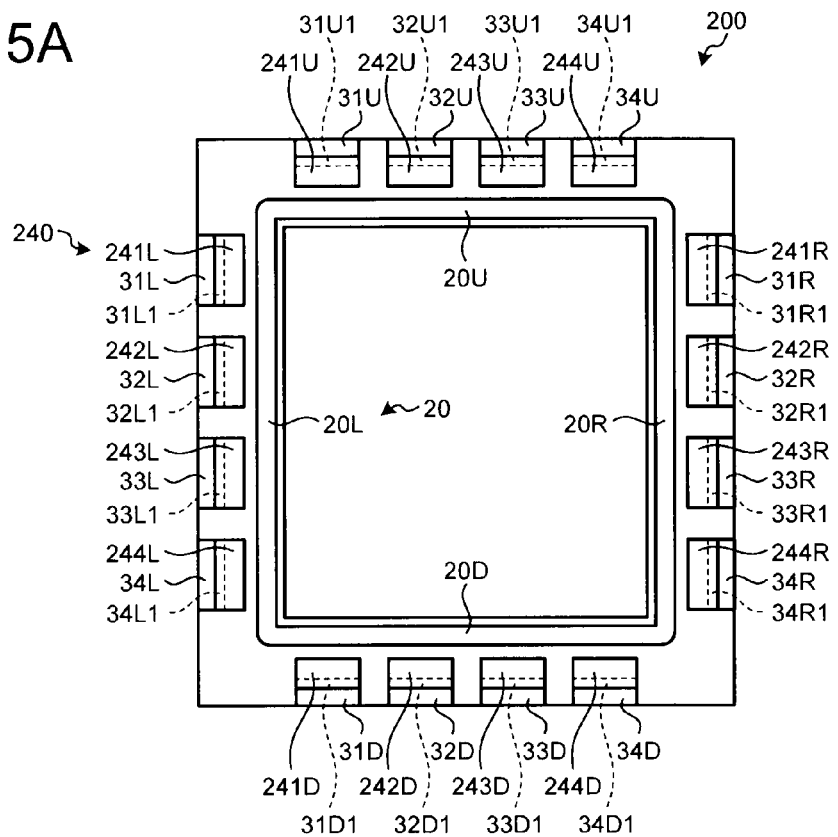
FIGS. 5A and 5B are views illustrating a configuration of a semiconductor device according to a second embodiment.
Figure 5B:
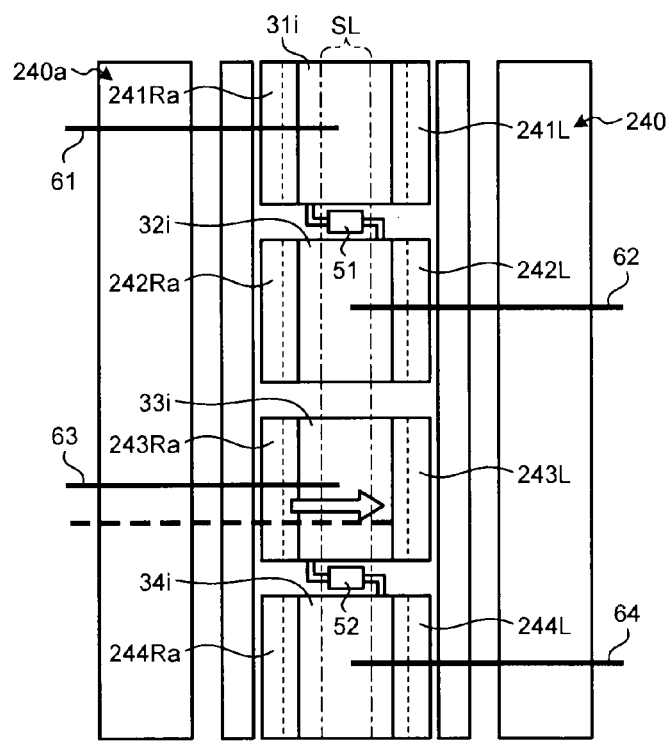

Next, a semiconductor device 200 according to a second embodiment will be described with reference to FIGS. 5A and 5B. FIG. 5A is a plane view illustrating a layout configuration of the semiconductor device 200. FIG. 5B is a plane view illustrating an inspection method in the process (the inspection process) illustrated in FIG. 3B. A description will be made below in connection with portions different from the first embodiment.

The semiconductor device 200 includes an insulating film pattern 240. The insulating film pattern 240 includes a plurality of patterns (a plurality of first patterns) 241L to 244L, a plurality of patterns 241R to 244R, a plurality of patterns 241U to 244U, and a plurality of patterns (a plurality of second patterns) 241D to 244D.

The plurality of patterns 241L to 244L are ones obtained when the pattern 40L (see FIG. 1A) is divided to correspond to the plurality of inspection pad pieces 31L to 34L (e.g. into units cut to the size of the inspection pad piece). Thus, the plurality of patterns 241L to 244L cover the edge portions 31L1 to 34L1 of the inspection pad pieces 31L to 34L at the portion 20L side, along edge portions 21L1 to 24L1 of the portion 20L (see FIG. 1A) of the edge seal 20 at the side near the inspection pad pieces 31L to 34L, respectively. For example, the plurality of patterns 241L to 244L cover the edge portions 31L1 to 34L1 of the inspection pad pieces 31L to 34L at the portion 20L side, respectively, without covering the edge portions 21L1 to 24L1 of the portion 20L of the edge seal 20 at the side near the inspection pad pieces 31L to 34L.

The plurality of patterns 241R to 244R are ones that are obtained when the pattern 40R (see FIG. 1A) is divided to correspond to the plurality of inspection pad pieces 31R to 34R (e.g. into units cut by the size of the inspection pad piece). Thus, the plurality of patterns 241R to 244R cover the edge portions 31R1 to 34R1 of the inspection pad pieces 31R to 34R at the portion 20R side, along edge portions 21R1 to 24R1 of the portion 20R (see FIG. 1A) of the edge seal 20 at the side near the inspection pad pieces 31R to 34R, respectively. For example, the plurality of patterns 241R to 244R cover the edge portions 31R1 to 34R1 of the inspection pad pieces 31R to 34R at the portion 20R side, respectively, without covering the edge portions 21R1 to 24R1 of the portion 20R of the edge seal 20 at the side near the inspection pad pieces 31R to 34R.

The plurality of patterns 241U to 244U are ones obtained when the pattern 40U (see FIG. 1A) is divided to correspond to the plurality of inspection pad pieces 31U to 34U (e.g. into units cut by the size of the inspection pad piece). Thus, the plurality of patterns 241U to 244U cover the edge portions 31U1 to 34U1 of the inspection pad pieces 31U to 34U at the portion 20U side, along edge portions 21U1 to 24U1 of the portion 20U (see FIG. 1A) of the edge seal 20 at the side near the inspection pad pieces 31U to 34U, respectively. For example, the plurality of patterns 241U to 244U cover the edge portions 31U1 to 34U1 of the inspection pad pieces 31U to 34U at the portion 20U side, respectively, without covering the edge portions 21U1 to 24U1 of the portion 20U of the edge seal 20 at the side near the inspection pad pieces 31U to 34U.

The plurality of patterns 241D to 244D are ones obtained when the pattern 40D (see FIG. 1A) is divided to correspond to the plurality of inspection pad pieces 31D to 34D (e.g. into units cut by the size of the inspection pad piece). Thus, the plurality of patterns 241D to 244D cover the edge portions 31D1 to 34D1 of the inspection pad pieces 31D to 34D at the portion 20D side, along edge portions 21D1 to 24D1 of the portion 20D (see FIG. 1A) of the edge seal 20 at the side near the inspection pad pieces 31D to 34D, respectively. For example, the plurality of patterns 241D to 244D cover the edge portions 31D1 to 34D1 of the inspection pad pieces 31D to 34D at the portion 20D side, respectively, without covering the edge portions 21D1 to 24D1 of the portion 20D of the edge seal 20 at the side near the inspection pad pieces 31D to 34D.

In the method of manufacturing the semiconductor device 200, in the process illustrated in FIG. 3A, insulating film patterns 240 and 240a are patterned as illustrated in FIG. 5B. Then, in the process (inspection process) illustrated in FIG. 3B, when the inspection probes 61 to 64 are excessively pressed down to establish a physical contact with the inspection pads 31i to 34i, for example, even if the tip of the inspection probe 63 is misaligned as indicated by a void arrow in FIG. 5B, the tip of the inspection probe 63 is difficult to slip out of the inspection pad 33i and can enter a state indicated by a dotted line. That is, each of the insulating film patterns 240 and 240a functions as a bank for preventing the tip of the inspection probe from slipping out of the inspection pad at both sides of the scribe line SL. Thus, in the process (the inspection process) illustrated in FIG. 3B, the tips of the inspection probes 61 to 64 easily come in contact with the inspection pads 31i to 34i. As a result, the test (inspection) of the TEGs 51 and 52 can be performed.

As described above, according to the second embodiment, the semiconductor device 200 suitable for easily establishing a contact to the inspection pad in the inspection process can be provided.

Third Embodiment

Figure 6A:
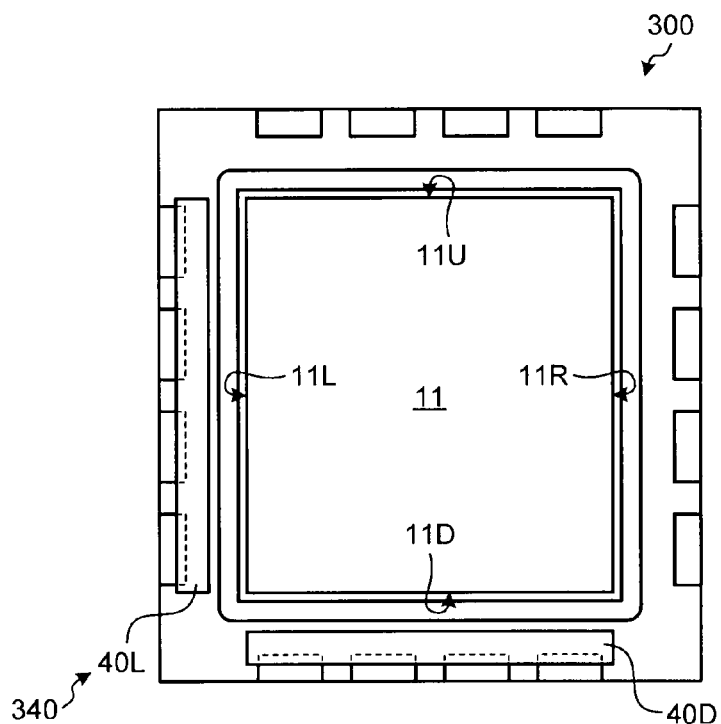
FIGS. 6A and 6B are views illustrating a configuration of a semiconductor device according to a third embodiment.
Figure 6B:
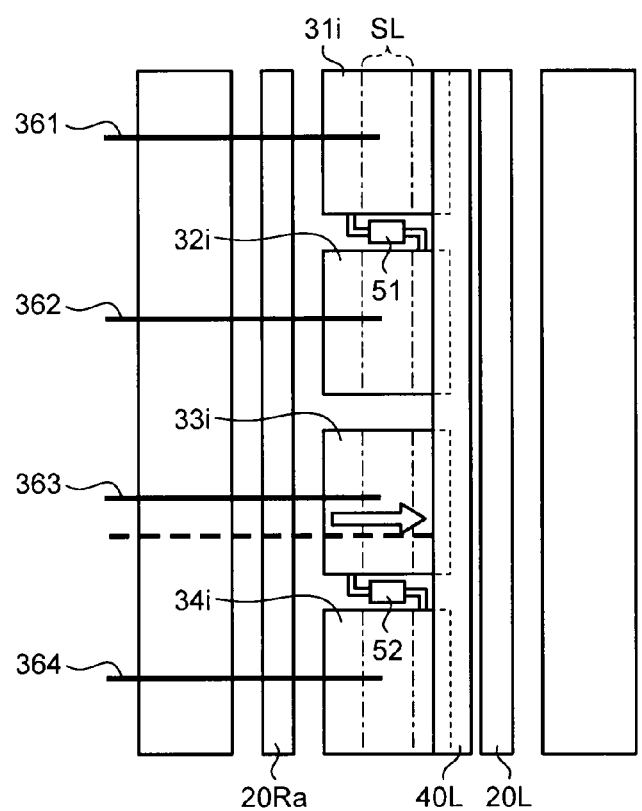

Next, a semiconductor device 300 according to a third embodiment will be described with reference to FIGS. 6A and 6B. FIG. 6A is a plane view illustrating a layout configuration of the semiconductor device 300. FIG. 6B is a plane view illustrating an inspection method in the process (the inspection process) illustrated in FIG. 3B. A description will be made below in connection with portions different from the first embodiment.

The semiconductor device 300 includes an insulating film pattern 340. At one side (for example, the side 11 L side) of the chip area 11 on the surface 10a (see FIG. 1B) of the semiconductor substrate 10 in a direction (a first direction) parallel to the side 11D and one side (for example, the side 11D side) in a direction (a second direction) parallel to the side 11L of the chip area 11, the insulating film patterns 340 cover the edge portions of the inspection pad pieces 31L to 34D at the edge seal 20 side, along the edge portions of the edge seals 20 at the side near the inspection pad pieces 31L to 34D. For example, the insulating film pattern 340 includes the pattern 40L and the pattern 40D but does not include the pattern 40R and the pattern 40U (see FIG. 1B).

In a method of manufacturing the semiconductor device 300, in the process illustrated in FIG. 3A, the insulating film pattern 340 is patterned at one side of the scribe line SL as illustrated in FIG. 6B. Then, in the process (the inspection process) illustrated in FIG. 3B, when inspection probes 361 to 364 are excessively pressed down to establish a physical contact with the inspection pads 31i to 34i, for example, even if the tip of the inspection probe 363 is misaligned as indicated by a void arrow in FIG. 6B, the tip of the inspection probe 363 is difficult to slip out of the inspection pad 33i and can enter a state indicated by a dotted line. That is, in the case of the type in which the inspection probes 361 to 364 come in contact with the inspection pads from one side of the scribe line SL, the insulating film pattern 340 functions as a bank for preventing the tips of the inspection probes from slipping out of the inspection pads at one side of the scribe line SL. Thus, in the process (the inspection process) illustrated in FIG. 3B, the tips of the inspection probes 361 to 364 easily come in contact with the inspection pads 31i to 34i. As a result, the test (inspection) of the TEGs 51 and 52 can be performed.

As described above, according to the third embodiment, it is possible to provide the semiconductor device 300 suitable for easily establishing a contact with the inspection pad in the inspection process in the case of the type in which the inspection probes 361 to 364 come in contact with the inspection pads from one side of the scribe line SL.

Alternatively, the insulating film pattern 340 may include the pattern 40R and the pattern 40U instead of the pattern 40L and the pattern 40D (see FIG. 1B).

Fourth Embodiment

Figure 7A:
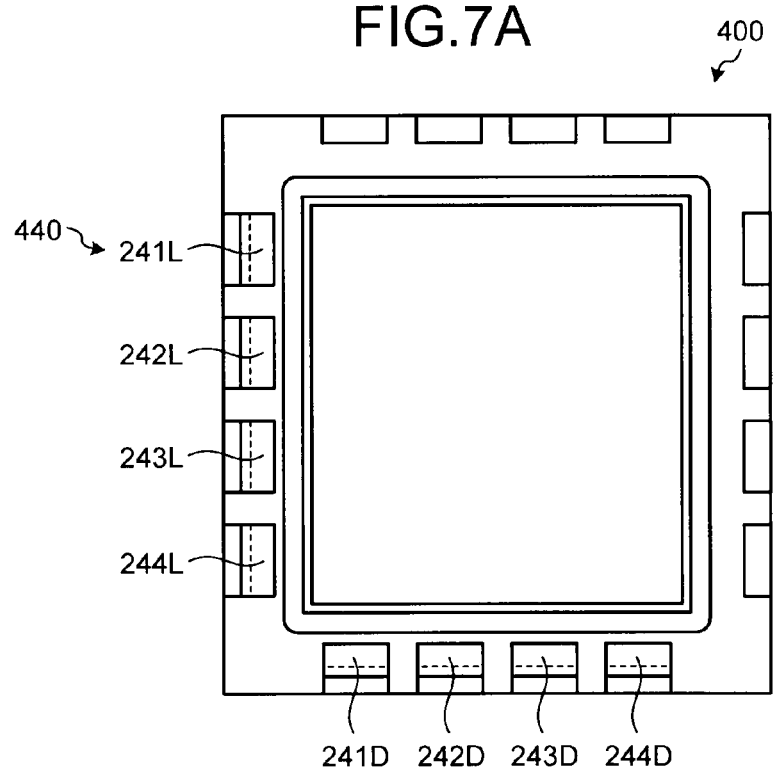
FIGS. 7A and 7B are views illustrating a configuration of a semiconductor device according to a fourth embodiment.
Figure 7B:
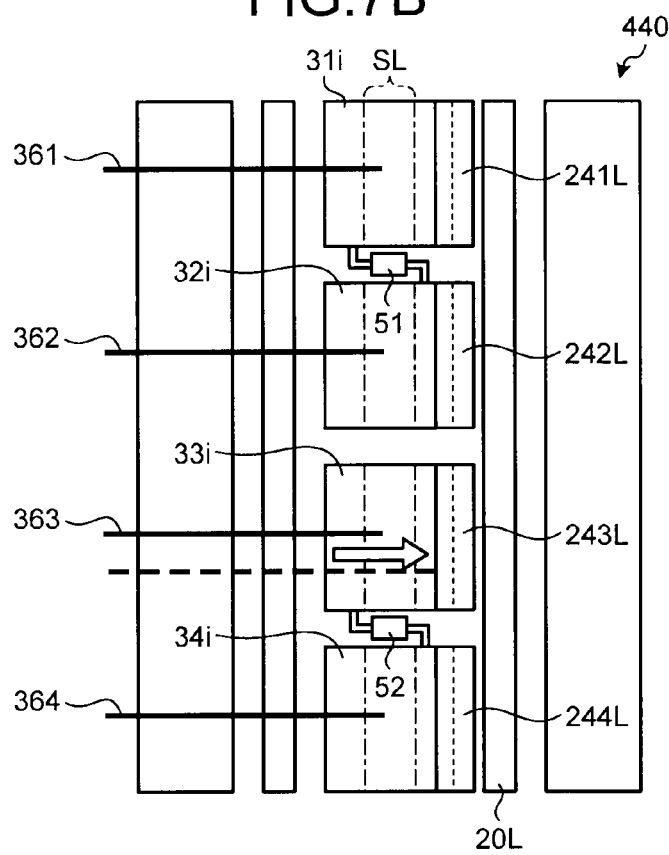

Next, a semiconductor device 400 according to a fourth embodiment will be described with reference to FIGS. 7A and 7B. FIG. 7A is a plane view illustrating a layout configuration of the semiconductor device 400. FIG. 7B is a plane view illustrating an inspection method in the process (the inspection process) illustrated in FIG. 3B. A description will be made below in connection with portions different from the third embodiment.

The semiconductor device 400 includes an insulating film pattern 440. The insulating film pattern 440 includes a plurality of patterns 241L to 244L and a plurality of patterns 241D to 244D but does not include a plurality of patterns 241R to 244R and a plurality of patterns 241U to 244U (see FIG. 5A).

In a method of manufacturing the semiconductor device 400, in the process illustrated in FIG. 3A, the insulating film pattern 440 is patterned at one side of the scribe line SL as illustrated in FIG. 7B. Then, in the process (the inspection process) illustrated in FIG. 3B, when inspection probes 361 to 364 are excessively pressed down to establish a physical contact with the inspection pads 31*i* to 34*i*, for example, even if the tip of the inspection probe 363 is misaligned as indicated by a void arrow in FIG. 6B, the tip of the inspection probe 363 is difficult to slip out of the inspection pad 33*i* and can enter a state indicated by a dotted line. That is, in the case of the type in which the inspection probes 361 to 364 come in contact with the inspection pads from one side of the scribe line SL, the insulating film pattern 440 functions as a bank for preventing the tips of the inspection probes from slipping out of the inspection pads at one side of the scribe line SL. Thus, in the process (the inspection process) illustrated in FIG. 3B, the tips of the inspection probes 361 to 364 easily come in contact with the inspection pads 31*i* to 34*i*. As a result, the test (inspection) of the TEGs 51 and 52 can be performed.

As described above, according to the fourth embodiment, it is possible to provide the semiconductor device 400 suitable for easily establishing a contact with the inspection pad in the inspection process when the inspection probes 361 to 364 come in contact with the inspection pads from one side of the scribe line SL.

Alternatively, the insulating film pattern 440 may include a plurality of patterns 241R to 244R and a plurality of patterns 241U to 244U instead of a plurality of patterns 241L to 244L and a plurality of patterns 241D to 244D (see FIG. 5A).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a semiconductor substrate including a chip area formed at an inward side of the semiconductor substrate when viewed in a direction perpendicular to a surface of the semiconductor substrate;
   an edge seal disposed around the chip area on the surface to protect the chip area;
   a plurality of pad pieces disposed on an edge region on the surface; and
   an insulating film pattern covering edge portions of the plurality of pad pieces at a side of the edge seal, at least at one side of the chip area on the surface in a first direction and at least one side of the chip area on the surface in a second direction,
   wherein each of the semiconductor substrate and the chip area has a rectangular shape,
   the edge seal includes
      a first portion extending along a first side of the chip area, and
      a second portion extending along a second side adjacent to the first side of the chip area
   the plurality of pad pieces include
      a plurality of first pad pieces disposed parallel to the first side on the edge region, and
      a plurality of second pad pieces disposed parallel to the second side on the edge region; and
   the insulating film pattern includes
      a plurality of first patterns, each covering the edge portion of the first pad piece at a side of the first portion, and
      a plurality of second patterns, each covering the edge portion of the second pad piece at a side of the second portion;
   wherein the plurality of first patterns cover the edge portions of the plurality of first pad pieces at a side of the first portion without covering an edge portion of the first portion at a side of the plurality of first pad pieces, and
   the plurality of second patterns cover the edge portions of the plurality of second pad pieces at a side of the second portion without covering an edge portion of the second portion at a side of the plurality of second pad pieces.

2. The semiconductor device according to claim 1, wherein a maximum thickness of the insulating film pattern is larger than a maximum thickness of the pad piece.

3. The semiconductor device according to claim 1, wherein a thickness of a portion of the insulating film pattern that covers the pad piece is larger than a width of a tip of a probe that comes into contact with a non-cut pad including the pad piece.

4. The semiconductor device according to claim 1, wherein each of the semiconductor substrate and the chip area has a rectangular shape,
   the edge seal includes
      a first portion extending along a first side of the chip area and
      a second portion extending along a second side adjacent to the first side of the chip area;
   the plurality of pad pieces include
      a plurality of first pad pieces disposed parallel to the first side on the edge region, and
      a plurality of second pad pieces disposed parallel to the second side on the edge region; and
   the insulating film pattern includes
      a first pattern extending, in a straight line form, across the plurality of first pad pieces to cover the edge portions of the first pad pieces at the first portion side, and
      a second pattern extending, in a straight line form, across the plurality of second pad pieces to cover the edge portions of the second pad pieces at the second portion side.

5. The semiconductor device according to claim 4, wherein the plurality of first pad pieces are arranged along the first side, and
   the plurality of second pad pieces are arranged along the second side.

6. The semiconductor device according to claim 5, wherein the first pattern extends, in a straight line form, along the first side, between the first portion and the plurality of first pad pieces, and
   the second pattern extends, in a straight line form, along the second side, between the second portion and the plurality of second pad pieces.

7. The semiconductor device according to claim 4,
wherein the first pattern covers the edge portions of the plurality of first pad pieces at a side of the first portion without covering an edge portion of the first portion at a side of the plurality of first pad pieces, and the second pattern covers the edge portions of the plurality of second pad pieces at a side of the second portion without covering an edge portion of the second portion at a side of the plurality of second pad pieces.

8. The semiconductor device according to claim 4,
wherein the edge seal includes
- a third portion extending along a third side of the chip area and
- a fourth portion extending along a fourth side adjacent to the third side of the chip area;

the plurality of pad pieces include
- a plurality of third pad pieces disposed parallel to the third side on the edge region, and
- a plurality of fourth pad pieces disposed parallel to the fourth side on the edge region; and the insulating film pattern includes
- a third pattern extending, in a straight line form, across the plurality of third pad pieces to cover the edge portions of the third pad pieces at the third portion side and
- a fourth pattern extending, in a straight line form, across the plurality of fourth pad pieces to cover the edge portions of the fourth pad pieces at the fourth portion side.

9. The semiconductor device according to claim 1,
wherein the plurality of first pad pieces are arranged along the first side, and
the plurality of second pad pieces are arranged along the second side.

10. The semiconductor device according to claim 9,
wherein the plurality of first patterns are arranged corresponding to the plurality of first pad pieces, and
the plurality of second patterns are arranged corresponding to the plurality of second pad pieces.

11. The semiconductor device according to claim 1,
wherein the edge seal includes
- a third portion extending along a third side of the chip area, and
- a fourth portion extending along a fourth side adjacent to the third side of the chip area;

the plurality of pad pieces include
- a plurality of third pad pieces disposed parallel to the third side on the edge region, and
- a plurality of fourth pad pieces disposed parallel to the fourth side on the edge region; and the insulating film pattern includes
- a plurality of third patterns covering the edge portions of the third pad pieces at a side of the third portion, and
- a plurality of fourth patterns covering the edge portions of the fourth pad pieces at a side of the fourth portion.

12. The semiconductor device according to claim 1,
wherein the edge seal extends in a loop form to surround the chip area.

13. The semiconductor device according to claim 1,
wherein the edge seal is formed of metal,
each of the plurality of pad pieces is formed of metal, and
the insulating film pattern is formed of an insulating material.

* * * * *